US009673737B2

(12) United States Patent
Baldus

(10) Patent No.: US 9,673,737 B2
(45) Date of Patent: Jun. 6, 2017

(54) CLAMP WITH CERAMIC ELECTRODE

(71) Applicant: Berliner Glas KGaA Herbert Kubatz GmbH & Co., Berlin (DE)

(72) Inventor: Oliver Baldus, Berlin (DE)

(73) Assignee: Berliner Glas KGaA Herbert Kubatz GmbH & Co., Berlin (DE)

( * ) Notice: Subject to any disclaimer, the term of this patent is extended or adjusted under 35 U.S.C. 154(b) by 84 days.

(21) Appl. No.: 14/723,608

(22) Filed: May 28, 2015

(65) Prior Publication Data
US 2015/0349669 A1 Dec. 3, 2015

(30) Foreign Application Priority Data
May 28, 2014 (DE) .................. 10 2014 008 031

(51) Int. Cl.
*H02N 13/00* (2006.01)
*H01L 21/683* (2006.01)
(Continued)

(52) U.S. Cl.
CPC ............... *H02N 13/00* (2013.01); *B23K 1/00* (2013.01); *B23K 1/0008* (2013.01); *B23K 1/19* (2013.01); *B23K 35/00* (2013.01); *B23K 35/0205* (2013.01); *B23K 35/0222* (2013.01); *B23K 35/0238* (2013.01); *B23K 35/222* (2013.01); *B23K 35/24* (2013.01); *B23K 35/30* (2013.01); *B23K 35/302* (2013.01); *B23K 35/3006* (2013.01); *B23K 35/325* (2013.01); *B23K 35/402* (2013.01); *H01L 21/6831* (2013.01);
(Continued)

(58) Field of Classification Search
CPC ............................ H02N 13/00; H01L 21/6831

USPC .......................................................... 361/234
See application file for complete search history.

(56) References Cited

U.S. PATENT DOCUMENTS

| 4,502,094 A | 2/1985 | Lewin et al. |
| 5,535,090 A | 7/1996 | Sherman |

(Continued)

FOREIGN PATENT DOCUMENTS

| EP | 1521120 A2 | 4/2005 |
| EP | 2793083 A1 | 10/2014 |

(Continued)

OTHER PUBLICATIONS

English abstract for JP 2007027494 A (2007).
(Continued)

*Primary Examiner* — Scott Bauer
(74) *Attorney, Agent, or Firm* — Caesar Rivise, PC

(57) ABSTRACT

A holding apparatus (100) for electrostatically holding a component (1), in particular a silicon wafer, includes at least one base body (10, 10A, 10B) which is composed of a first plate (11A) and a second plate (12), the first plate (11A) being arranged on an upper side (10A) of the base body (10, 10A, 10B) and the second plate are made of an electrically insulating material, a plurality of projecting, upper burls (13A) which are arranged on the upper side (10A) of the base body (10, 10A, 10B) and form a support surface for the component (1), and a first electrode which is arranged to receive a clamping voltage, wherein the first plate (11A) is made of an electrically conductive, silicon-including ceramic and forms the first electrode. A method for producing the holding apparatus (100) is also described.

11 Claims, 1 Drawing Sheet

(51) Int. Cl.
  *B23K 35/30* (2006.01)
  *B23K 1/00* (2006.01)
  *B23K 35/32* (2006.01)
  *B23K 1/19* (2006.01)
  *H01L 21/687* (2006.01)
  *B23K 35/40* (2006.01)
  *B23K 35/00* (2006.01)
  *B23K 35/02* (2006.01)
  *B23K 35/22* (2006.01)
  *B23K 35/24* (2006.01)
  *B23K 101/20* (2006.01)
  *B23K 101/40* (2006.01)

(52) U.S. Cl.
  CPC ...... *H01L 21/6833* (2013.01); *H01L 21/6875* (2013.01); *B23K 2201/20* (2013.01); *B23K 2201/40* (2013.01)

(56) References Cited

U.S. PATENT DOCUMENTS

| | | | |
|---|---|---|---|
| 8,476,167 | B2 | 7/2013 | Van Mierlo et al. |
| 8,902,562 | B2 | 12/2014 | Helmus et al. |
| 2003/0168496 | A1* | 9/2003 | Shinkai ............ B23K 1/19 228/180.21 |
| 2005/0181617 | A1 | 8/2005 | Bosch |
| 2006/0016554 | A1 | 1/2006 | Ahn |
| 2009/0079525 | A1* | 3/2009 | Sijben ............ G03F 7/70708 335/72 |
| 2009/0308538 | A1 | 12/2009 | Yonekura et al. |
| 2009/0310274 | A1 | 12/2009 | Koyama et al. |
| 2010/0039747 | A1* | 2/2010 | Sansoni ............ H01L 21/6833 361/234 |
| 2010/0206454 | A1 | 8/2010 | Maeda et al. |
| 2012/0299253 | A1 | 11/2012 | Kosakai et al. |
| 2013/0033690 | A1 | 2/2013 | Helmus et al. |
| 2013/0148253 | A1 | 6/2013 | Komatsu et al. |
| 2013/0308116 | A1 | 11/2013 | Helmus et al. |
| 2014/0008880 | A1 | 1/2014 | Miura et al. |
| 2014/0042716 | A1 | 2/2014 | Miura et al. |
| 2014/0376148 | A1 | 12/2014 | Sasaki et al. |

FOREIGN PATENT DOCUMENTS

| | | |
|---|---|---|
| JP | 2007027494 A | 2/2007 |
| WO | 2013118781 A1 | 8/2013 |
| WO | 2013160026 A2 | 10/2013 |

OTHER PUBLICATIONS

U.S. Appl. No. 14/723,635, filed May 28, 2015.
U.S. Appl. No. 14/724,083, filed May 28, 2015.
U.S. Appl. No. 14/724,215, filed May 28, 2015.

* cited by examiner

CLAMP WITH CERAMIC ELECTRODE

BACKGROUND OF THE INVENTION

The invention relates to a holding apparatus being adapted to electrostatically hold a component, in particular a silicon wafer. The invention relates also to a method for producing the holding apparatus. Applications of the invention are in the provision of devices or tools for holding components by means of electrostatic forces, in particular for holding semiconductor components, for example silicon wafers.

Holding apparatuses for holding components electrostatically, which are also referred to as electrostatic holding apparatuses, electrostatic clamping apparatuses, electrostatic clamps, ESCs or electrostatic chucks, are known in general. An important application of electrostatic holding apparatuses is in holding silicon wafers in lithographic semiconductor processing, for example in chip production, in which the particular advantages of electrostatic holding, such as the ease of switching of electrostatic holding or clamping forces, a high positioning accuracy and the reliable fixing of silicon wafers, are exploited.

Typically, an electrostatic holding apparatus has a structure having a plurality of plate-type or layer-type elements that fulfil differing functions (see e.g. US 2013/0308116 A1). At least one plate-type element (referred to as a first plate in the following) performs the electrostatic holding function of the holding apparatus. For this purpose, the first plate is equipped with an electrode device, by means of which the electrostatic holding forces are generated. According to US 2013/0308116 A1, the electrode device comprises a plurality of electrodes which are embedded in the first plate. At least one further plate-type element (referred to as a second plate in the following) performs a carrying and cooling function. The second plate is produced from a mechanically stiff ceramic, for example, and is fixedly connected to the first plate. The electrostatic holding apparatus has on its upper side a plurality of projecting, upper burls which form a support surface for the silicon wafer and are integrally connected to the second plate, for example according to US 2013/0308116 A1.

A conventional electrostatic holding apparatus, for example according to U.S. Pat. No. 4,502,094 A or US 2013/0308116 A1, has the following disadvantages. The production of the holding apparatus is complex because of the embedding of the electrodes into the first plate. The electrodes each require a separate connection, likewise embedded into the first plate, for applying a clamping voltage. As a result, the electrostatic holding forces can be distributed inhomogeneously along the support surface and may exhibit a change over time (ageing). The embedded electrodes are at a relatively large distance from the component to be held and therefore require a high clamping voltage.

The mentioned disadvantages occur not only in the case of electrostatic holding apparatuses for silicon wafers, but also in the case of holding apparatuses having embedded electrodes, such as, for example, for glass plates having a transparent electrode (ITO), which form substrates for AMLCD, for example.

Objects of the Invention

The objective of the invention is to provide an improved electrostatic holding apparatus which avoids disadvantages of conventional techniques. The holding apparatus is to permit in particular simplified production, a reduction of the clamping voltage without impairment of the holding forces, a homogeneous distribution of electrostatic holding forces and/or permanently stable operation. A further objective of the invention is to provide an improved method for producing the electrostatic holding apparatus which avoids disadvantages of conventional techniques and is distinguished in particular by a simplified procedure.

These objectives are achieved, respectively, by a holding apparatus of the invention and by a method for the production thereof in accordance with the invention.

DESCRIPTION OF THE INVENTION

According to a first general aspect of the invention there is provided a holding apparatus for electrostatically holding a component, in particular a silicon wafer, having at least one base body which comprises at least one first plate and at least one second plate. The first plate is arranged on an upper side of the base body, on which a support surface for receiving the component is provided when the holding apparatus is in use. The second plate, which is made of an electrically insulating material, carries the first plate. The holding apparatus is equipped with a plurality of projecting, upper burls, which are also referred to as carrier elements, are arranged on the upper side of the base body and span a support surface for the component. The holding apparatus further has a first electrode (upper electrode) which is arranged to receive a clamping voltage. According to the invention, the first plate is produced from an electrically conductive, silicon-including (Si-based) ceramic, and the first electrode is formed by the first plate. The entire body of the first plate is the upper electrode. The first plate is identical with the upper (ceramic) electrode.

According to a second general aspect of the invention there is provided a method for producing a holding apparatus according to the first aspect of the invention, wherein the first plate and the second plate are connected by high-temperature soldering, preferably by means of a solder that includes Ti, Cu and/or Ag.

The invention offers the following advantages. With the dual function of the Si-based ceramic for generating the electrostatic holding force (electrode function) and for receiving the component (holding function), the structure of the holding apparatus and the production thereof are simplified considerably. It is possible to dispense with the separate production of electrodes during production of the holding apparatus. The number of process steps is reduced and the production time is shortened. The robustness and longevity of the electrical contacting of the electrode are improved. Furthermore, the thermal coupling of the applied component (e.g. of the wafer) with the holding apparatus can be substantially improved. Tests by the inventors have shown that time-dependent holding force (clamping pressure) effects can be reduced significantly in comparison with conventional holding apparatuses. Finally, the electrode holding plate provides a more homogeneous clamping pressure distribution, which is advantageous in particular for the configuration of the holding apparatus as a monopolar clamp.

A further advantage, in particular for the handling of wafers, is that the thermal expansion of the ceramic electrode can be matched very accurately to the expansion of Si (about 2.5 ppm), the heat conduction nevertheless being equal to that of a highly conducting metal, for example Al.

For monopolar holding, the holding apparatus preferably has one single base body. For bipolar holding, a plurality, for example two, base bodies are preferably arranged side by side in a plane parallel to the planar extent thereof.

Preferably, the first plate is made of the electrically conductive, Si-based ceramic, i.e. the first plate is made of a ceramic that includes Si. SiC-including ceramics, such as, for example, SiSiC or SSiC ceramic, have been found to be particularly advantageous. The second plate is preferably made of an electrically insulating solid, particularly preferably of $Si_3N_4$ or SiC ceramic or of borosilicate glass (e.g. glass having the product name Borofloat 33).

According to a preferred embodiment of the invention, the first plate is adapted to receive a clamping voltage directly. For this purpose, the first plate is equipped with at least one first electrical contact region which is configured for connecting the first plate to a voltage source. The contact region allows the voltage source to be connected directly to the electrode, so that the robustness of the holding apparatus is improved further.

If, according to a further preferred embodiment of the invention, the second plate has on its side facing the upper side of the base body a recess which receives the first plate in a form-fitting manner, advantages for stable fixing of the first plate are obtained.

Advantageously, there are various possibilities for configuring the upper burls in dependence on the requirements of a specific application. According to a first variant, the upper burls are connected electrically conductively to the first plate. Because the value of the electrical holding force is distance-dependent, this preferred embodiment of the invention allows the operating voltage to be reduced while the holding force remains the same. According to a further variant, the upper burls are particularly preferably produced from the same electrically conductive, Si-based ceramic as the first plate. For example, the upper burls can be integrally connected to the first plate. The upper burls can be produced by structuring of the first plate, for example by means of etching, so that the production of the holding apparatus is simplified further.

According to a further preferred embodiment of the invention, the holding apparatus has an upper insulating layer which covers the upper side of the base body, including the upper burls. The upper insulating layer consists of a dielectric material, such as, for example, $SiO_2$, $Ta_2O_5$, SiN and/or HfO. A hard coating for reducing wear can advantageously be applied to the burls.

Advantageously, the upper insulating layer can form the free surface of the holding apparatus and can be configured to receive the component to be held. This allows a component made of a material that is electrically conductive to be held. Furthermore, the thin dielectric on the burls exhibits substantially reduced polarization properties in comparison with a ceramic dielectric or insulator.

Alternatively, the upper insulating layer can carry further electrode layers which advantageously permit contacting of the component to be held, for example a connection with ground potential. The electrode layers (upper electrode layers) are arranged solely on the end faces of the burls, i.e. on their free ends, and optionally on the side walls of the burls to a limited extent, so that the component to be held rests on the upper electrode layers and comes into electrical contact therewith. Between the burls, the upper insulating layer is free of additional electrode layers, so that the desired electrostatic holding forces are generated in the gaps between the burls under the effect of the electric field between the first plate (electrode) and the component being held.

Particularly preferably, the upper electrode layers are produced from amorphous carbon ($\alpha$C, DLC, diamond like carbon) or an electrically conductive metal carbide or metal nitride. These materials offer high wear resistance in the case of mechanical stress caused by components repeatedly being applied to and removed from the burls. A further advantage of carbides or nitrides, such as, for example, WC, TiC, SiN or TiN, is their passivating action for avoiding contamination of the underlying dielectric or insulator while at the same time exhibiting extreme hardness.

According to a further, particularly preferred embodiment of the invention, the holding apparatus is equipped with a second electrode (lower electrode) on the side opposite the first plate, i.e. on the underside of the base body. This advantageously allows the holding apparatus to be fixed temporarily to a stationary carrier platform under the action of electrostatic holding forces. The second electrode is advantageously formed by a third plate, which is arranged on the underside of the second plate opposite the first plate. The third plate is likewise produced from an electrically conductive, Si-based ceramic, preferably SiSiC or SSiC ceramic. Preferably, the underside of the holding apparatus is also equipped with projecting burls (lower burls), which form a support surface (carrier surface) for the holding apparatus on the carrier platform. The lower burls are arranged on the underside of the base body distributed over the extent of the third plate with mutual gaps, so that unwanted particles can be received in the gaps between the lower burls.

According to a further advantageous embodiment of the invention, the holding apparatus is equipped with at least one temperature adjustment device, in particular a resistance heating system, a Peltier cooling system and/or at least one temperature adjustment medium line. The at least one temperature adjustment device is embedded in the base body, preferably between the first and second plate or in the third plate. The at least one temperature adjustment medium line is designed to adjust the temperature of the holding apparatus by means of a flowing temperature adjustment medium, in particular cooling medium or heating medium.

BRIEF DESCRIPTION OF THE DRAWINGS

Further details and advantages of the invention will be described in the following with reference to the accompanying drawings, in which.

Preferred embodiments of the electrostatic holding apparatus according to the invention and of the method for the production thereof are described in the following with reference, by way of example, to features of an electrostatic holding apparatus for silicon wafers. It is emphasized that the implementation of the invention is not limited to holding apparatuses for silicon wafers. Rather, other applications of the holding apparatus are also conceivable, such as, for example, for holding glass plates having transparent electrodes for the production of screens, in which cases the form of the support surfaces and/or carrier surfaces of the first and/or second holding elements, their structuring, the materials and the dimensions are matched to the specific requirements. Furthermore, it is emphasized that the implementation of the invention is not limited to the variants, shown by way of example, of the holding apparatus having a first, second and third plate, each of which is produced in one piece. Alternatively, at least one of the plates can be produced in multilayer form from a plurality of partial plates. Finally, the figures do not show illustrations of holding apparatuses that are to scale, but illustrate in particular the use of the first plate and, where appropriate, of the third plate as an electrode.

The structure of the base body of the holding apparatus can be chosen as is known per se from conventional holding apparatuses. Further details of the specific form of the holding apparatus, for example as a monopolar or bipolar holding apparatus, the temperature adjustment and the application of voltages in order to generate the electrostatic holding forces will not be described, in so far as they are known from conventional holding apparatuses.

Figure 1:
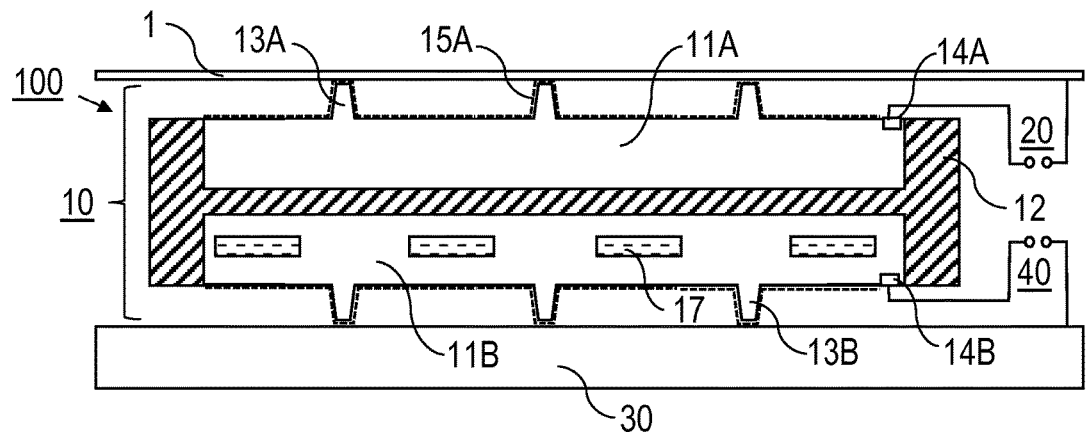
FIG. 1: is a schematic sectional view of a first embodiment of the electrostatic holding apparatus according to the invention.

FIG. 1 shows a schematic sectional view of a first embodiment of the electrostatic holding apparatus 100 according to the invention when used in semiconductor processing. The holding apparatus 100 comprises a base body 10 having a stack structure, comprising a first plate 11A, a second plate 12 and a third plate 11B. The first and third plates 11A, 11B are made of SiSiC, for example. For a monopolar holding apparatus, the first and third plates 11A, 11B have, for example, a circular shape with a diameter of 30 cm and in each case a thickness of 5 mm. Alternatively, larger dimensions can be provided, for example for holding glass plates having a transparent electrode a diameter of up to 2 m.

The second plate 12 is made of $SiN_4$, for example. The first and third plates 11A, 11B are connected to the second plate 12 on both sides. The second plate 12 has on its upper side and underside recesses into which the first and third plates 11A, 11B are set.

The first and third plates 11A, 11B have projecting upper or lower burls 13A, 13B, respectively, which span a support surface for a component 1, for example a silicon wafer, or a carrier surface for positioning of the holding apparatus 100 on a carrier platform 30. The burls 13A, 13B have, for example, the form of cuboids, cylinders, pyramids, cones, truncated pyramids and/or truncated cones, preferably with a height in the range of from 5 µm to 25 µm, a diameter of from 20 µm to 100 µm and a mutual gap of 1 mm.

Insulating layers 15A, 15B are arranged on the surfaces of the first and third plates 11A, 11B, resp., which insulating layers electrically insulate the holding apparatus 100 from the component 1 or the carrier platform 30. The insulating layers 15A, 15B are made, for example, of $SiO_2$ with a thickness of 2 µm.

Temperature adjustment medium lines 17 which are coupled with a temperature adjustment device (not shown) are embedded into the third plate 11B. By means of the temperature adjustment device, a temperature adjustment medium circuit is formed, by means of which the temperature of the holding apparatus 100 can be adjusted.

The first and third plates 11A, 11B are electrically conductive. For receiving a voltage, the first and third plates 11A, 11B are each equipped with a first and a third contact region 14A, 14B which is configured for electrical connection to a voltage source 20 or 40, respectively. The contact regions 14A, 14B each comprise, for example, a blind bore in the first or third plate 11A, 11B, which blind bore has a diameter of 0.5 mm, for example, and is designed as a fit. A metal sleeve, for example of gold, which receives a line for connection to the voltage source 20 or 40 is fitted into the bore.

The recesses on both sides of the second plate 12 have the advantage that all the outside faces of the holding apparatus 100 are electrically insulated. Furthermore, the surroundings are shielded from electrostatic effects in the lateral direction by the edges of the second plate 12.

The holding apparatus 100 is produced by first prefabricating the plates 11A, 12 and 11B individually. The first plate 11A and the third plate 11B are subsequently each connected to the second plate 12 by high-temperature soldering. The electrical and hydraulic connections are then coupled with the contact regions 14A, 14B or the temperature adjustment medium lines 17.

Figure 2:
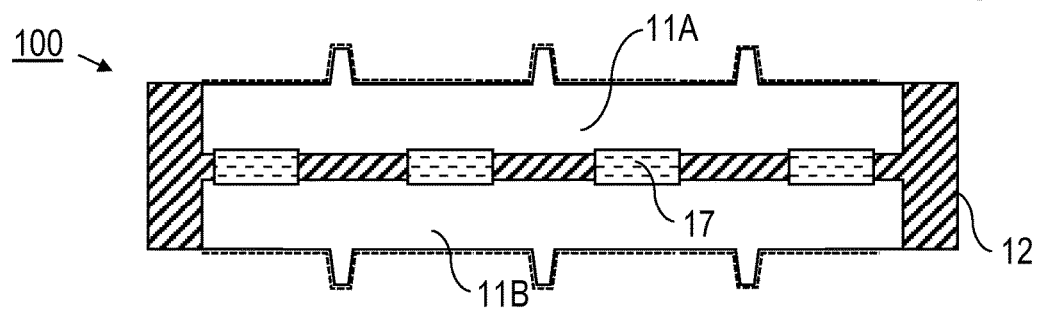
FIG. 2: is a schematic sectional view of a further embodiment of the electrostatic holding apparatus according to the invention.

FIG. 2 shows by way of example a modified embodiment of the holding apparatus 100 without the component 1 and without the carrier platform 30. In this case, the holding apparatus 100 is formed as in FIG. 1 with a stack structure consisting of the first plate 11A, the second plate 12 and the third plate 11B. Deviating from the embodiment according to FIG. 1, the temperature adjustment medium lines 17 are embedded not in the third plate 11B but in the second plate 12 and partially in the first and third plates 11A, 11B.

Figure 3:
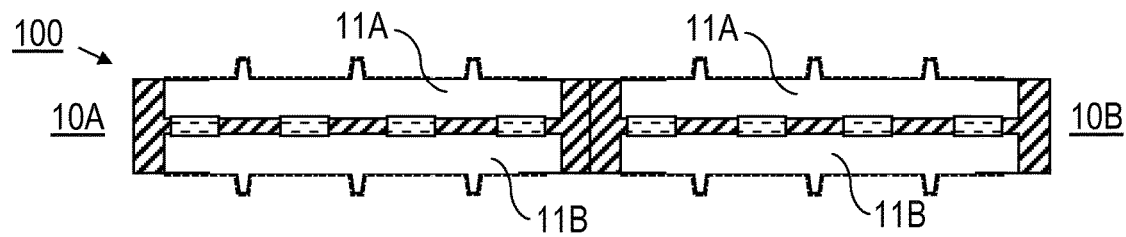
FIG. 3: is a schematic illustration of a bipolar holding apparatus.

FIG. 3 shows a variant of the invention with a bipolar electrostatic holding apparatus 100. The holding apparatus 100 is in this case composed of two base bodies 10A, 10B, each of which has a semi-circular shape, for example, and is composed with a stack structure like the holding apparatuses according to FIG. 1 or 2. The base bodies 10A, 10B are connected together in an electrically insulating manner in a common plane so that, in combination, the holding apparatus 100 is formed with a circular base area. The first and third plates 11A, 11B of the base bodies 10A and 10B are connected to separate voltage sources (not shown) of opposite polarities.

Figure 4:
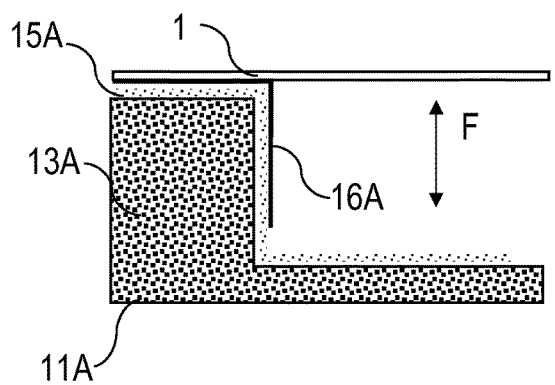
FIG. 4: is a schematic sectional view of a burl on the upper side of a holding apparatus according to the invention.

FIG. 4 illustrates, in an enlarged sectional view, a portion of the first plate 11A with the upper burl 13A. The insulating layer 15A of $SiO_2$ is deposited on the surface of the first plate 11A. The electrode layer 16A, with which the component 1 can be grounded, is arranged limited to the surface of the upper burl 13A. The grounding electrode layer 16A is important for monopolar holding apparatuses in particular. The electrode layer 16A is connected to ground potential via a separate line (not shown), which runs on the surface of the insulating layer 15A.

By means of the structure according to FIG. 4, it is possible for the electrostatic holding force F to act in the gaps between the projecting burls 13A (see double arrow), while no electrostatic holding force is formed at the burls 13A at which the component 1 touches the electrode layer 16A. The holding force F can correspond to a clamping pressure of 500 mbar at a clamping voltage of 1000 V, for example.

The features of the invention disclosed in the preceding description, the drawings and the claims can be of significance, both singly or in combination, for the implementation of the invention in its various embodiments.

What is claimed is:
1. A holding apparatus adapted to electrostatically hold a component, comprising:
   at least one base body which comprises a first plate and a second plate, the first plate being arranged on an upper side of the base body and the second plate being made of an electrically insulating material, a plurality of projecting, upper burls which are arranged on the upper side of the base body and form a support surface for the component, an upper insulating layer which covers the upper side of the base body having the upper burls and comprises a dielectric material, upper electrode layers on the upper insulating layer, wherein the upper electrode layers are limited to and arranged on the upper burls such that the component comes into electrical contact with the upper electrode layers, and a first electrode which is arranged to receive a clamping voltage, wherein the first plate comprises an electrically conductive, silicon-comprising ceramic and forms the first electrode.

2. The holding apparatus according to claim 1, wherein the first plate comprises SiSiC or SSiC ceramic.

3. The holding apparatus according to claim 1, wherein the first plate has at least one first electric contact region for connection to a voltage source.

4. The holding apparatus according to claim 1, wherein the second plate comprises $Si_3N_4$, SiC ceramic or borosilicate glass.

5. The holding apparatus according to claim 1, wherein the second plate has on a side facing the upper side of the base body a recess into which the first plate is set.

6. The holding apparatus according to claim 1, wherein the upper burls have at least one of the features:

the upper burls are connected electrically conductively to the first plate, the upper burls are made of an electrically conductive, Si-based ceramic, and the upper burls are integrally connected to the first plate.

7. The holding apparatus according to claim 1, wherein the upper electrode layers comprise α-C or a metal carbide.

8. The holding apparatus according to claim 1, which further comprises a third plate which is arranged on an underside of the base body, and a plurality of projecting, lower burls which are arranged on the underside of the base body and form a carrier surface for the holding apparatus on a carrier platform, wherein the third plate comprises an electrically conductive, silicon-comprising ceramic and forms a second electrode.

9. The holding apparatus according to claim 1, which comprises at least one temperature adjustment device which is embedded in the base body.

10. A method for producing a holding apparatus according to claim 1, said method comprising connecting the first plate and the second plate by high-temperature soldering.

11. The method according to claim 10, wherein a solder that comprises Ti, Cu and/or Ag is used for the high-temperature soldering.

* * * * *